(12) United States Patent
Ueda

(10) Patent No.: US 6,818,507 B2
(45) Date of Patent: Nov. 16, 2004

(54) METHOD OF MANUFACTURING SEMICONDUCTOR DEVICE INCLUDING MEMORY REGION AND LOGIC CIRCUIT REGION

(75) Inventor: Mamoru Ueda, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/342,307

(22) Filed: Jan. 15, 2003

(65) Prior Publication Data

US 2003/0211691 A1 Nov. 13, 2003

(30) Foreign Application Priority Data

Jan. 23, 2002 (JP) ........................................ 2002-014261

(51) Int. Cl.⁷ ............................................. H01L 21/336
(52) U.S. Cl. ...................... 438/257; 438/258; 438/267; 438/692
(58) Field of Search ................................. 438/200, 201, 438/257–267, 279, 286, 300, 315, 350, 633, 634, 691–693; 257/315

(56) References Cited

U.S. PATENT DOCUMENTS

| | | | |
|---|---|---|---|
| 4,962,064 A | * 10/1990 | Haskell et al. ............... | 438/437 |
| 5,362,669 A | * 11/1994 | Boyd et al. .................. | 438/437 |
| 5,408,115 A | 4/1995 | Chang | |
| 5,422,504 A | 6/1995 | Chang et al. | |
| 5,491,113 A | * 2/1996 | Murota ....................... | 438/624 |
| 5,494,838 A | 2/1996 | Chang et al. | |
| 5,665,202 A | * 9/1997 | Subramanian et al. ....... | 438/692 |
| 5,721,172 A | * 2/1998 | Jang et al. .................... | 438/424 |
| 5,969,383 A | 10/1999 | Chang et al. | |
| 5,976,949 A | * 11/1999 | Chen ........................... | 438/427 |
| 6,177,318 B1 | 1/2001 | Ogura et al. | |
| 6,248,633 B1 | 6/2001 | Ogura et al. | |
| 6,255,166 B1 | 7/2001 | Ogura et al. | |
| 6,413,821 B1 | 7/2002 | Ebina et al. | |
| 6,531,350 B2 | * 3/2003 | Satoh et al. ................. | 438/197 |
| 2002/0100929 A1 | 8/2002 | Ebina et al. | |
| 2002/0127805 A1 | 9/2002 | Ebina et al. | |
| 2003/0157767 A1 | 8/2003 | Kasuya | |
| 2003/0166320 A1 | 9/2003 | Kasuya | |
| 2003/0166321 A1 | 9/2003 | Kasuya | |
| 2003/0166322 A1 | 9/2003 | Kasuya | |
| 2003/0186505 A1 | 10/2003 | Shibata | |
| 2003/0190805 A1 | 10/2003 | Inoue | |

FOREIGN PATENT DOCUMENTS

| | | |
|---|---|---|
| JP | A 7-161851 | 6/1995 |
| JP | B1 2978477 | 9/1999 |
| JP | A 2001-156188 | 6/2001 |

OTHER PUBLICATIONS

U.S. patent application Ser. No. 10/689,990, Kasuya, filed Oct. 22, 2003.

(List continued on next page.)

*Primary Examiner*—Amir Zarabian
*Assistant Examiner*—Khanh Duong
(74) *Attorney, Agent, or Firm*—Oliff & Berridge, PLC

(57) ABSTRACT

In a method for manufacturing a semiconductor device that includes a memory region and a logic circuit region, the invention provides a dielectric layer that is better planarized upon polishing. The invention provides a semiconductor substrate having a conductive layer that is to become a word gate of the non-volatile semiconductor device, a stopper layer formed above the conductive layer, and sidewall-like control gates formed on both side surfaces of the conductive layer through ONO films above a semiconductor layer in a memory region, and a gate electrode of a dielectric gate field effect transistor formed above the semiconductor layer in a logic circuit region. A dielectric layer is formed over an entire surface of the memory region and the logic circuit region of the semiconductor substrate. A polishing restricting layer is formed above a part of the dielectric layer. The dielectric layer is polished such that the stopper layer within the memory region is exposed, and the gate electrode within the logic circuit region is not exposed.

4 Claims, 15 Drawing Sheets

OTHER PUBLICATIONS

U.S. patent application Ser. No. 10/690,025, Kasuya, filed Oct. 22, 2003.
U.S. patent application Ser. No. 10/636,562, Inoue, filed Aug. 8, 2003.
U.S. patent application Ser. No. 10/636,581, Yamamukai, filed Aug. 8, 2003.
U.S. patent application Ser. No. 10/636,582, Inoue, filed Aug. 8, 2003.
U.S. patent application Ser. No. 10/614,985, Inoue, filed Jul. 9, 2003.
U.S. patent application Ser. No. 10/689,993, Kasuya, filed Oct. 22, 2003.
U.S. patent application Ser. No. 10/689,987, Kasuya, filed Oct. 22, 2003.
Yutaka Hayashi et al., "Twin Monos Cell with Dual Control Gates," 2000, IEEE VLSI Technology Digest.
Kuo–Tung Chang et al., "A New Sonos Memory Using Source–Side Injection For Programming," IEEE Electron Device Letters, vol. 19, No. 7, Jul. 1998, pp 253–255.
Wei–Ming Chen et al., "A Novel Flash Mrmory Device with S Pilt Gate Source Side Injection and Ono Charge Storage Stack (Spin)," 1997, VLSI Technology Digest, pp 63–64.
U.S. patent application Ser. No. 09/953,855, Ebina et al., filed Sep. 18, 2001.
U.S. patent application Ser. No. 10/234,095, Ebina et al., filed Sep. 5, 2002.
U.S. patent application Ser. No. 10/244,627, Ebina et al., filed Sep. 17, 2002.
U.S. patent application Ser. No. 10/234,197, Ebina et al., filed Sep. 5, 2002.
U.S. patent application Ser. No. 10/244,623, Ebina et al., filed Sep. 17, 2002.

* cited by examiner

METHOD OF MANUFACTURING SEMICONDUCTOR DEVICE INCLUDING MEMORY REGION AND LOGIC CIRCUIT REGION

BACKGROUND OF THE INVENTION

1. Field of Invention

The present invention relates to a method for manufacturing a semiconductor device that includes a memory region and a logic circuit region. More particularly, the invention relates to a method for manufacturing a semiconductor device, where a non-volatile memory device formed in the memory region has two charge stored regions for one word gate.

2. Description of Related Art

Non-volatile semiconductor memory devices exist that are referred to as a MONOS (Metal Oxide Nitride Oxide Semiconductor) type or a SONOS (Silicon Oxide Nitride Oxide Silicon) type in which a gate dielectric layer between a channel region and a control gate is formed from a stacked layered body of a silicon oxide layer and a silicon nitride layer, where a charge is trapped in the silicon nitride layer.

A MONOS type non-volatile memory device is shown in FIG. 20, and is disclosed in H. Hayashi, et al, 2000 Symposium on VLSI Technology Digest of Technical Papers p.122–p.123.

The MONOS type memory cell 100 has a word gate 14 formed over a semiconductor substrate 10 through a first gate dielectric layer 12. Also, a first control gate 20 and a second control gate 30 in the form of sidewalls are disposed on both sides of the word gate 14. A second gate dielectric layer 22 is disposed between a bottom section of the first control gate 20 and the semiconductor substrate 10, and a dielectric layer 24 is disposed between a side surface of the first control gate 20 and the word gate 14. Similarly, a second gate dielectric layer 22 is disposed between a bottom section of the second control gate 30 and the semiconductor substrate 10, and a dielectric layer 24 is disposed between a side surface of the second control gate 30 and the word gate 14. Impurity layers 16 and 18 that each form a source region or a drain region are formed in the semiconductor substrate 10 between the opposing control gate 20 and the control gate 30 of adjacent memory cells.

In this manner, each memory cell 100 includes two MONOS type memory elements on side surfaces of the word gate 14. Also, these MONOS type memory elements are independently controlled. Therefore, a single memory cell 100 can store 2-bit information.

The following manufacturing method can be used to form a memory region including such a MONOS type memory cell and a logic circuit region including a peripheral circuit for the memory. Basically, memory cells in a memory region are formed, and then a peripheral circuit in a logic circuit region is formed. The memory region and the logic circuit region are formed, and then a variety of wiring layers are formed in upper layers above these regions through dielectric layers.

SUMMARY OF THE INVENTION

In the above manufacturing method, a dielectric layer, such as a silicon nitride layer, is formed, and then is polished by using a CMP (Chemical Mechanical Polishing) method. The upper surface of the dielectric layer, after polishing, may preferably be flat in order to execute various steps to be conducted thereafter with high precision, for example, in order to form wirings and the like to be formed in upper layers above the dielectric layer with high precision. However, the polishing rates are not uniform. For example, the logic circuit region may be polished relatively quickly compared to the memory region, and there may be occasions where step differences may be created in the upper surface of the dielectric layer after polishing.

The present invention addresses or solves the above and/or other problems in the related art technique described above, and provides, in a step of polishing a dielectric layer in a method for manufacturing a semiconductor device that includes a memory region and a logic circuit region, a technique to achieve a better planarization of the dielectric layer upon polishing.

To address or solve at least a part of the problems described above, a first exemplary method for manufacturing a semiconductor device in accordance with the present invention pertains to a method for manufacturing a semiconductor device including a memory region that includes a non-volatile memory device and a logic circuit region that includes a peripheral circuit for the non-volatile memory device. The method includes:

preparing a semiconductor substrate having a conductive layer that is to become a word gate of the non-volatile semiconductor device;

forming a stopper layer above the conductive layer;

forming sidewall-like control gates on both side surfaces of the conductive layer through ONO films above a semiconductor layer of the memory region;

forming a gate electrode of a dielectric gate field effect transistor above the semiconductor layer of the logic circuit region;

forming a dielectric layer over an entire surface of the memory region and the logic circuit region of the semiconductor substrate;

forming a polishing restricting layer above a part of the dielectric layer; and polishing the dielectric layer such that the stopper layer within the memory region is exposed, and the gate electrode within the logic circuit region is not exposed.

According to the manufacturing method described above, in the step of forming the polishing restricting layer, the polishing restricting layer can be formed above a region that is relatively quickly polished, for example, when the dielectric layer is polished. Consequently, step differences that may be created in the surface of the dielectric layer through polishing the dielectric layer can be reduced or suppressed, and the dielectric layer after polishing can be better planarized.

The step of forming the polishing restricting layer may preferably form the polishing restricting layer above the logic circuit region.

By so doing, when the dielectric layer above the logic circuit region is relatively quickly polished, the polishing in this region can be slowed down because the polishing restricting layer is formed above the region. Consequently, step differences that may be created in the surface of the dielectric layer can be reduced or suppressed, and the dielectric layer after polishing can be better planarized.

The polishing restricting layer can be formed with a silicon nitride or a metal.

Also, a second exemplary method for manufacturing a semiconductor device in accordance with the present invention pertains to a method for manufacturing a semiconductor device including a memory region that includes a non-volatile memory device and a logic circuit region that includes a peripheral circuit for the non-volatile memory device. The method includes:

forming a first dielectric layer above a semiconductor layer;

forming a first conductive layer above the first dielectric layer;

forming a stopper layer above the first conductive layer;

patterning the stopper layer and the first conductive layer in the memory region;

forming an ONO film over an entire surface of the memory region and the logic circuit region;

forming a second conductive layer above the ONO film;

anisotropically etching the second conductive layer to form sidewall-like control gates on both side surfaces of the first conductive layer through the ONO film at least within the memory region;

removing the stopper layer within the logic circuit region;

patterning the first conductive layer within the logic circuit region to form a gate electrode of a dielectric gate field effect transistor within the logic circuit region;

forming sidewall dielectric layers at least on both side surfaces of the gate electrode;

forming a first impurity layer that is to become a source region or a drain region of the non-volatile memory device and a second impurity layer that is to become a source region or a drain region of the dielectric gate field effect transistor;

forming a silicide layer on surfaces of the first impurity layer, the second impurity layer and the gate electrode;

forming a second dielectric layer over an entire surface of the memory region and the logic circuit region;

forming a polishing restricting layer over a part of the second dielectric layer;

polishing the second dielectric layer such that the stopper layer within the memory region is exposed, and the gate electrode within the logic circuit region is not exposed;

removing the stopper layer within the memory region; and patterning the first conductive layer within the memory region to form a word gate of the non-volatile memory device within the memory region.

Also in the second method for manufacturing a semiconductor device, and similarly to the first method for manufacturing a semiconductor device, in the step of forming the polishing restricting layer, the polishing restricting layer can be formed above a region that is relatively quickly polished, for example, when the second dielectric layer is polished. Consequently, step differences that may be generated in the surface of the second dielectric layer through polishing the second dielectric layer can be reduced or suppressed, and the second dielectric layer after polishing can be planarized better.

DETAILED DESCRIPTION OF PREFERRED EMBODIMENTS

Figure 1:
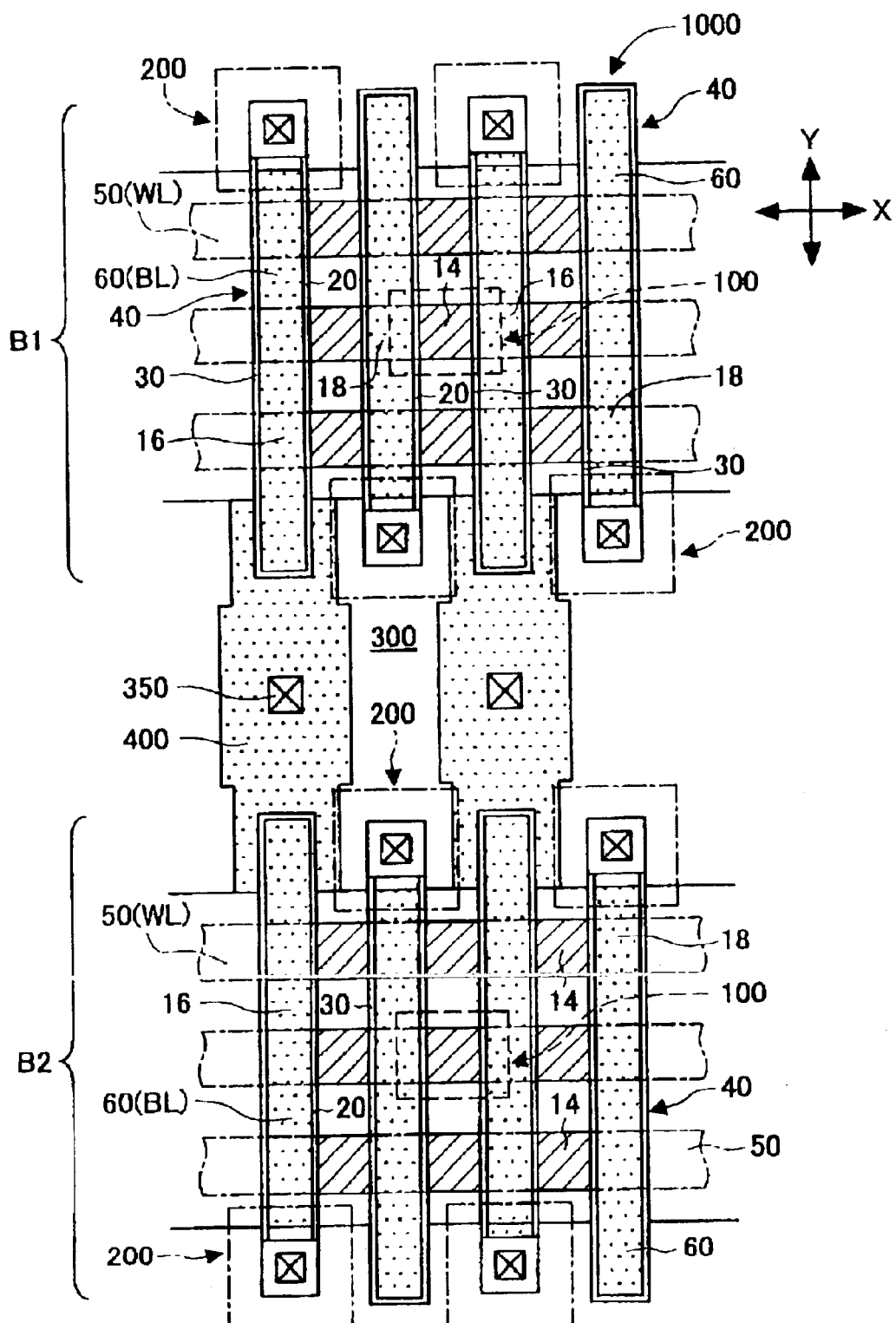
FIG. 1 is a schematic plan view illustrating a layout of a memory region of a semiconductor device.
Figure 2:
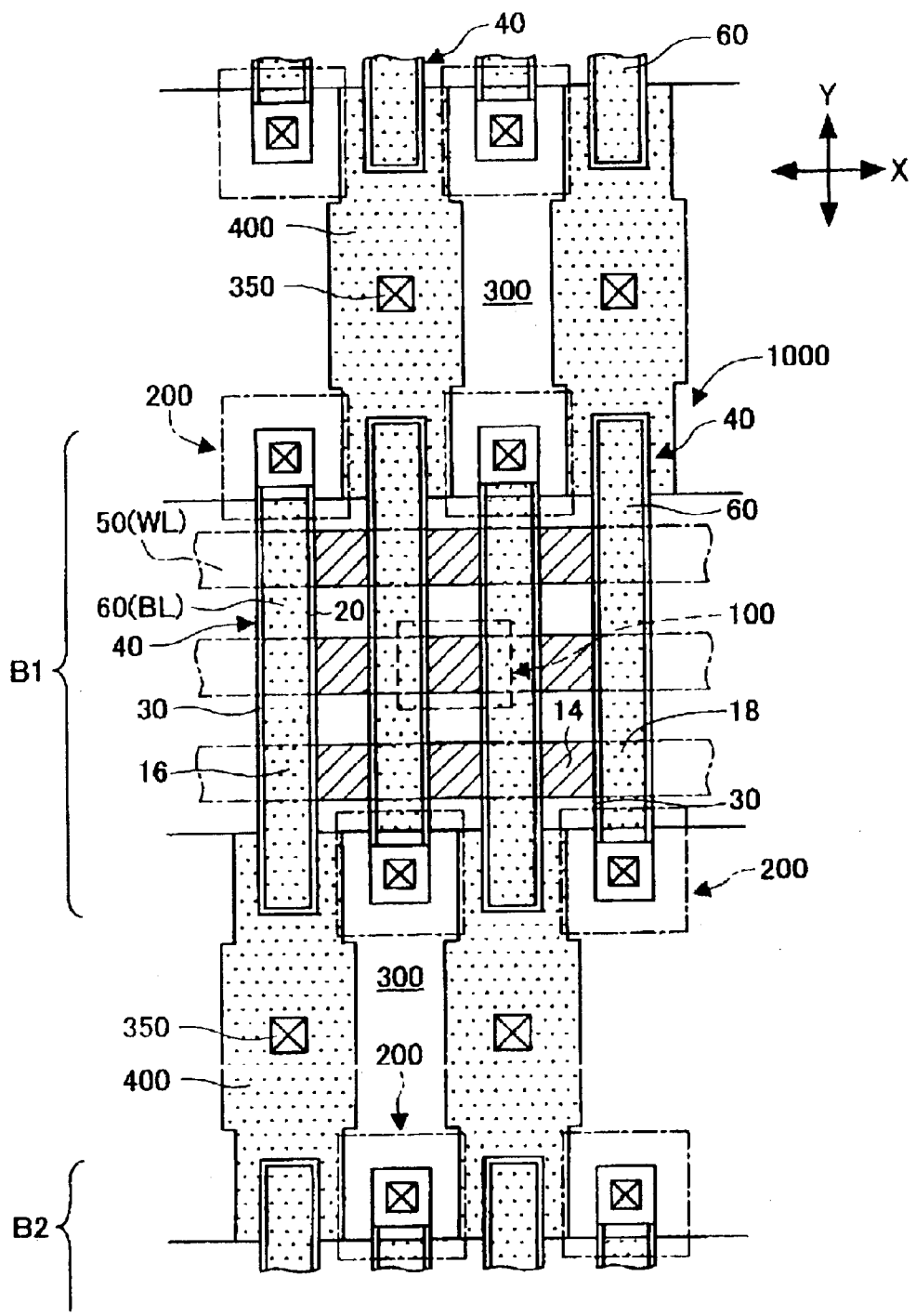
FIG. 2 is a schematic plan view illustrating a layout of a memory region of a semiconductor device.
Figure 3:
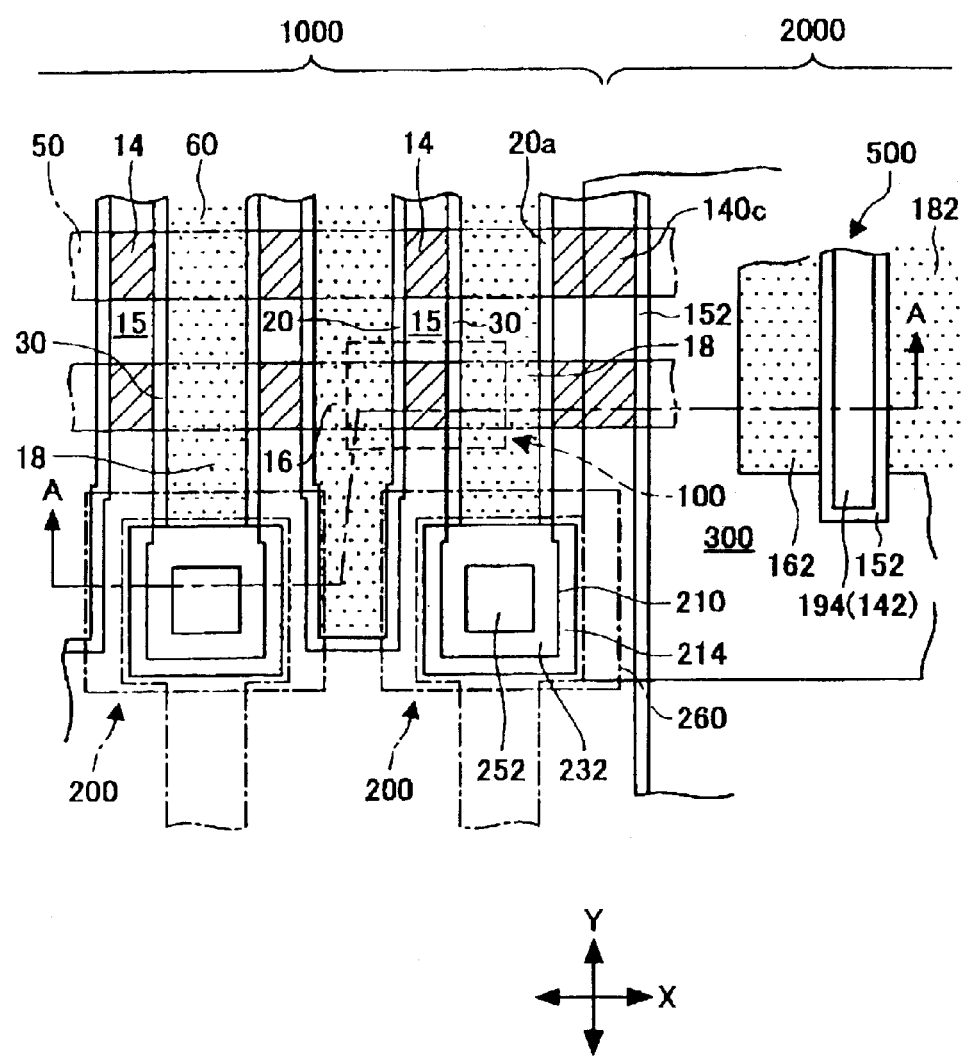
FIG. 3 is a schematic plan view of a significant part of a semiconductor device.
Figure 4:
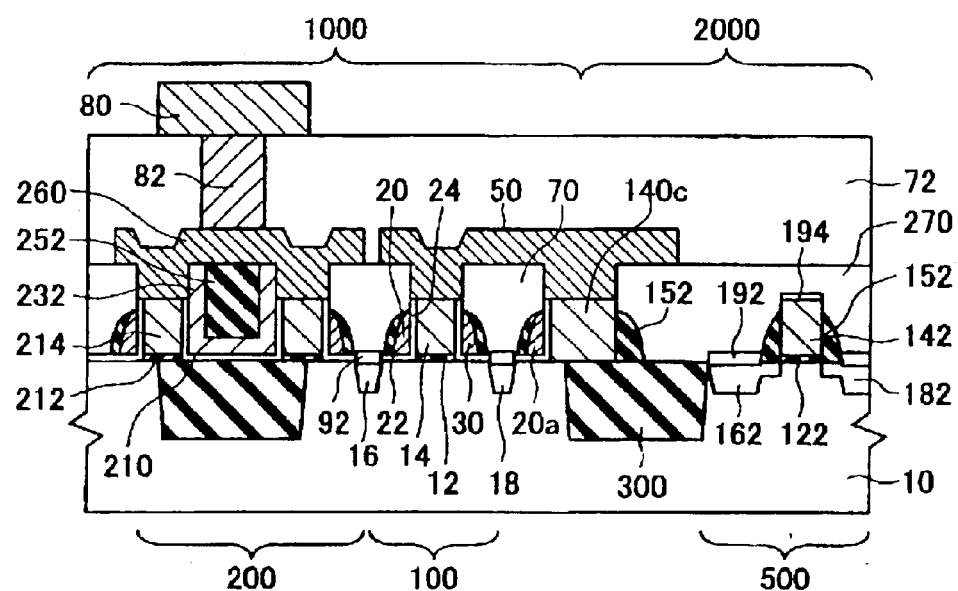
FIG. 4 is a schematic cross-sectional view taken along plane A—A of FIG. 3.

FIG. 1 and FIG. 2 are plan views illustrating layouts of memory regions of a semiconductor device that is obtained by a manufacturing method in accordance with an embodiment of the present invention. FIG. 3 is a plan view in part of the semiconductor device in accordance with the present embodiment. FIG. 4 is a cross-sectional view taken along plane A—A of FIG. 3.

The semiconductor device shown in FIGS. 1–4 includes a memory region 1000 having a memory cell array that is formed of MONOS type non-volatile memory devices (hereafter "memory cells") 100 arranged in a plurality of rows and columns in a matrix, and a logic circuit region 2000 that includes peripheral circuits for the memories.

A. Device Structure:

First, referring to FIG. 1 and FIG. 2, a layout of the memory region 1000 is described.

FIG. 1 shows a first block B1 that is a part of the memory region 1000, and a second block B2 adjacent to the first block. FIG. 2 shows the first block B1 and a contact structure of the first block B1.

An element isolation region 300 is formed in a part of the region between the first block B1 and the second block B2. A plurality of word lines (WL) 50 extending in an X direction (row direction) and a plurality of bit lines (BL) 60 extending in a Y direction (column direction) are provided in each of the blocks B1 and B2. Each one of the word lines 50 is connected to a plurality of word gates 14 arranged in the X direction. The bit lines 60 are formed of impurity layers 16 and 18.

A conductive layer 40, which forms the first and second control gates 20 and 30, is formed in a manner to enclose each of the impurity layers 16 and 18. In other words, the first and second control gates 20 and 30 extend respectively in the Y direction, and one end sections of one set of the first and second control gates 20 and 30 are mutually connected by the conductive layer 40 that extends in the X direction. Further, the other end sections of the one set of the first and second control gates 20 and 30 are both connected to one common contact section 200. Therefore, each of the first and second control gates 20 and 30 has a function of a control gate of a memory cell, and a function as a wiring that connects the control gates together that are arranged in the Y direction.

Each of the memory cells 100 includes one word gate 14, first and second control gates 20 and 30 formed on both sides of the word gate 14, and impurity layers 16 and 18 outside the control gates 20 and 30 and in a semiconductor substrate. The impurity layers 16 and 18 are shared by mutually adjacent memory cells.

The impurity layers 16 that are mutually arranged adjacent to each other in the Y direction, i.e., the impurity layer 16 formed in the block B1 and the impurity layer 16 formed in the block B2, are mutually electrically connected by a contact impurity layer 400 formed in the semiconductor substrate. The contact impurity layer 400 is formed on the opposite side of the common contact section 200 of the control gates with respect to the impurity layer 16.

A contact 350 is formed on the contact impurity layer 400. The bit lines 60 formed of the impurity layers 16 are electrically connected to wiring layers in upper layers through the contacts 350.

Similarly, two adjacent ones of the impurity layers 18 arranged in the Y direction are mutually electrically connected by the contact impurity layer 400. on the side where the common contact section 200 is not disposed (see FIG. 2).

As shown in FIG. 1, in each of the blocks, the plurality of common contact sections 200 for the impurity layers 16 and the impurity layers 18 are arranged on mutually opposite sides in a staggered fashion as viewed in a plan view layout. Similarly, in each of the blocks, the plurality of contact impurity layers 400 for the impurity layers 16 and the impurity layers 18 are arranged on mutually opposite sides in a staggered fashion as viewed in a plan view layout.

Next, referring to FIGS. 3 and 4, a plan structure and a cross-sectional structure of the semiconductor device are described. The logic circuit region 2000 where, for example, peripheral circuits for the memories are formed, is formed in an area adjacent to the memory region 1000. The memory region 1000 and the logic circuit region 2000 are electrically isolated from each other by an element isolation region 300. At least memory cells 100 are formed in the memory region 1000. At least dielectric gate field effect transistors (hereafter "MOS transistors") 500 that form a logic circuit are formed in the logic circuit region 2000.

First, the memory region 1000 is described.

As shown in FIG. 4, the memory cell 100 includes a word gate 14 that is formed through a first gate dielectric layer 12 above a semiconductor substrate 10, impurity layers 16 and 18 that are formed in the semiconductor substrate 10 and each form a source region or a drain region, and first and second control gates 20 and 30 in the form of sidewalls which are respectively formed along two sides of the word gate 14. Also, silicide layers 92 are formed on the impurity layers 16 and 18.

The first control gate 20 is formed above the semiconductor substrate 10 through a second gate dielectric layer 22, and is formed on one of the side surfaces of the word gate 14 through a side dielectric layer 24. Similarly, the second control gate 30 is formed above the semiconductor substrate 10 through a second gate dielectric layer 22, and is formed on the other side surface of the word gate 14 through a side dielectric layer 24.

The second gate dielectric layer 22 and the side dielectric layer 24 are ONO films. More specifically, each of the second gate dielectric layer 22 and the side dielectric layer 24 is a stacked layered film formed of a bottom silicon oxide layer (a first silicon oxide layer (O)), a silicon nitride layer (N) and a top silicon oxide layer (second silicon oxide layer (O)).

The first silicon oxide layer of the second gate dielectric layer 22 forms a potential barrier between a channel region and a charge stored region.

The silicon nitride layer of the second gate dielectric layer 22 functions as a charge stored region that traps carriers (for example, electrons).

The second silicon oxide layer of the second gate dielectric layer 22 forms a potential barrier between the control gate and the charge stored region.

The side dielectric layers 24 electrically isolates the word gate 14 from the control gates 20 and 30, respectively. Also, upper ends of the side dielectric layers 24 are positioned above the upper ends of the control gates 20 and 30 with respect to the semiconductor substrate 10 in order to reduce or prevent short-circuits between the word gate 14 and the first and second control gates 20 and 30.

The side dielectric layers 24 and the second gate dielectric layers 22 are formed in the same film forming steps, and have the same layered structure.

An embedded dielectric layer 70 is formed between the adjacent first control gate 20 and second control gate 30 of adjacent ones of the memory cells 100. The embedded dielectric layer 70 covers the control gates 20 and 30 such that at least they are not exposed. More specifically, an upper surface of the embedded dielectric layer 70 is positioned above the upper ends of the side dielectric layers 24 with respect to the semiconductor substrate 10. By forming the embedded dielectric layer 70 in this manner, electrical isolation of the first and second control gates 20 and 30 from the word gate 14 and the word line 50 can be more securely achieved.

A conductive layer to supply a predetermined potential to the control gates 20 and 30 is formed at the common contact section 200. The common contact section 200 is formed from a first contact dielectric layer 212, a second contact dielectric layer 210, a first contact conductive layer 214, a second contact conductive layer 232, a third contact dielectric layer 252, and a third contact conductive layer 260.

The first contact dielectric layer 212 is formed in the same steps in which the first gate dielectric layer 12 is formed.

The second contact dielectric layer 210 is formed in the same steps in which the second gate dielectric layer 22 and the side dielectric layer 24 are formed. Therefore, the second contact dielectric layer 210 is formed of a stacked layered body of a first silicon oxide layer, a silicon nitride layer and a second silicon oxide layer.

The first contact conductive layer 214 is formed in the same steps in which the word gate 14 is formed. The first contact conductive layer 214 is formed outside the second contact dielectric layer 210.

The second contact conductive layer 232 is formed inside the second contact dielectric layer 210. The second contact conductive layer 232 is formed in the same steps in which the first and second control gates 20 and 30 are formed, in a manner to be continuous with the control gates 20 and 30. Accordingly, the second contact conductive layer 232 and the control gates 20 and 30 are formed with the same materials.

The third contact dielectric layer 252 is formed inside the second contact conductive layer 232. The third contact dielectric layer 252 is formed in the same steps in which sidewall dielectric layers 152 are formed.

The third contact conductive layer 260 is formed in the same steps in which the word line 50 is formed, and is connected to the first contact conductive layer 214 and the second contact conductive layer 232.

A MOS transistor 500 is formed in the logic circuit region 2000. The MOS transistor 500 includes a gate electrode 142 formed above the semiconductor substrate 10 through a third gate dielectric layer 122, impurity layers 162 and 182 that are formed in the semiconductor substrate 10 and each form a source region or a drain region, and sidewall dielectric layers 152 which are respectively formed along two sides of the gate electrode 142. Further, silicide layers 192 are formed on upper surfaces of the impurity layers 162 and 182, and a silicide layer 194 is formed on an upper surface of the gate electrode 142.

The MOS transistor 500 is covered by a dielectric layer 270 in the logic circuit region 2000. The dielectric layer 270 is formed in the same steps in which the embedded dielectric layer 70 is formed.

A boundary section 140c, which is formed of the same material as that of the word gate 14 and the gate electrode 142, is formed in a boundary region between the memory region 1000 and the logic circuit region 2000, as shown in FIGS. 3 and 4. The boundary section 140c is formed in the same film forming steps in which the word gate 14 and the gate electrode 142 are formed. Also, at least a part of the boundary section 140c is formed above the element isolation region 300.

A sidewall-like conductive layer 20a, which is formed of the same material as that of the control gates 20 and 30, is formed on one of side surfaces of the boundary section 140c (on the side of the memory region 1000). The sidewall-like conductive layer 20a extends in the Y direction, and is electrically connected to an adjacent control gate 30 through the common contact section 200. The sidewall-like conductive layer 20a is not used as a control gate of the memory cell. However, through electrically connecting the sidewall-like conductive layer 20a to the adjacent control gate 30, the electrical characteristic of the control gate 30 adjacent to the sidewall-like conductive layer 20a can be made to be equal to the electrical characteristic of other control gates.

Also, a sidewall-like dielectric layer 152, which is formed in the same steps in which the sidewall dielectric layer 152 of the MOS transistor 500 is formed, is formed on the other side surface of the boundary section 140c (on the side of the logic circuit region 2000).

An interlayer dielectric layer 72 is formed over the semiconductor substrate 10 on which the memory cells 100 and the MOS transistors 500 are formed. Also, contact holes that reach the third contact conductive layers 260 of the common contact sections 200, for example, are formed through the interlayer dielectric layer 72. Conductive layers 82, such as tungsten plugs or copper plugs, are filled in the contact holes, and the conductive layers 82 are connected to wiring layers 80 that are formed above the interlayer dielectric layer 72.

B. Basic Method for Manufacturing Semiconductor Device:

Next, prior to describing a method for manufacturing a semiconductor device in accordance with an embodiment of the present invention, a basic manufacturing method that is the basis of the method is described first with reference to FIGS. 5–16. Each cross-sectional view shown in FIGS. 5–16 corresponds to a cross-section taken along plane A—A of FIG. 3. Also, portions in FIGS. 5–16 that are substantially the same as the portions indicated in FIGS. 1–4 are assigned the same reference numbers, and their description is not repeated.

Figure 5:
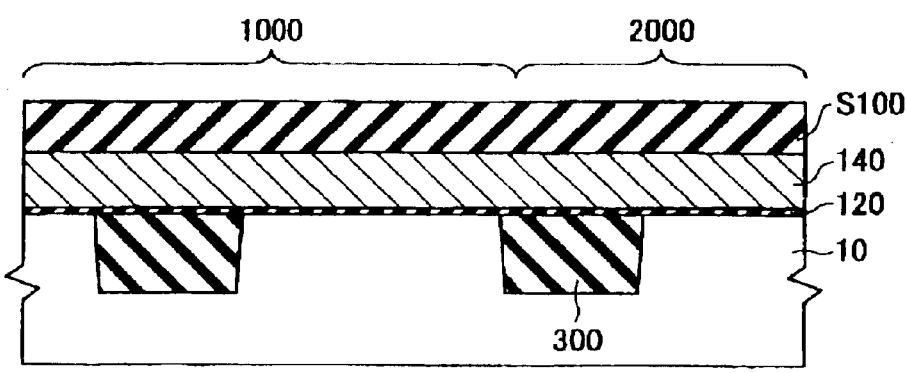
FIG. 5 is a cross-sectional view illustrating one step of a method for manufacturing the semiconductor device shown in FIGS. 1–4.

(1) First, as indicated in FIG. 5, an element isolation region 300 is formed on a surface of a semiconductor substrate 10 by a trench isolation method. Then, a contact impurity layer 400 (see FIG. 1) is formed in the semiconductor substrate 10 by an ion implantation.

Then, a dielectric layer 120 that is to become a gate dielectric layer is formed on the surface of the semiconductor substrate 10. This dielectric layer 120 corresponds to a first dielectric layer of the present invention. Then, a gate layer 140 that is to become word gates 14 and gate electrodes 142 is deposited on the dielectric layer 120. The gate layer 140 is formed of doped polysilicon. Then, a stopper layer S100 is formed over the gate layer 140. The stopper layer S100 would become a criterion, in a CMP (Chemical Mechanical Polishing) step to be conducted later, of the completion of the polishing step, and is formed of a silicon nitride layer.

Figure 6:
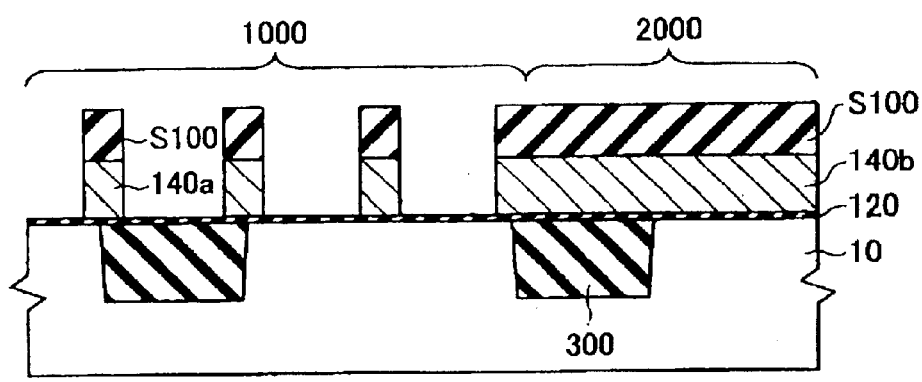
FIG. 6 is a cross-sectional view illustrating one step of the method for manufacturing the semiconductor device shown in FIGS. 1–4.

(2) As shown in FIG. 6, patterned gate layers 140a are formed in the memory region 1000. For example, a resist layer (not shown) that covers the entire area of the logic circuit region 2000 and extends to a portion of the memory region 1000 is formed. Then, the stopper layer S100 is patterned by using the resist layer as a mask. Then, the gate layer 140 is etched by using the patterned stopper layer as a mask. As a result, as shown in FIG. 6, the gate layer 140 is patterned to become the gate layers 140a in the memory region 1000. On the other hand, in this step, the gate layer 140 within the logic circuit region 2000 is not patterned (hereafter, the gate layer 140 within the logic circuit region is referred to as "140b" for convenience.)

Figure 7:
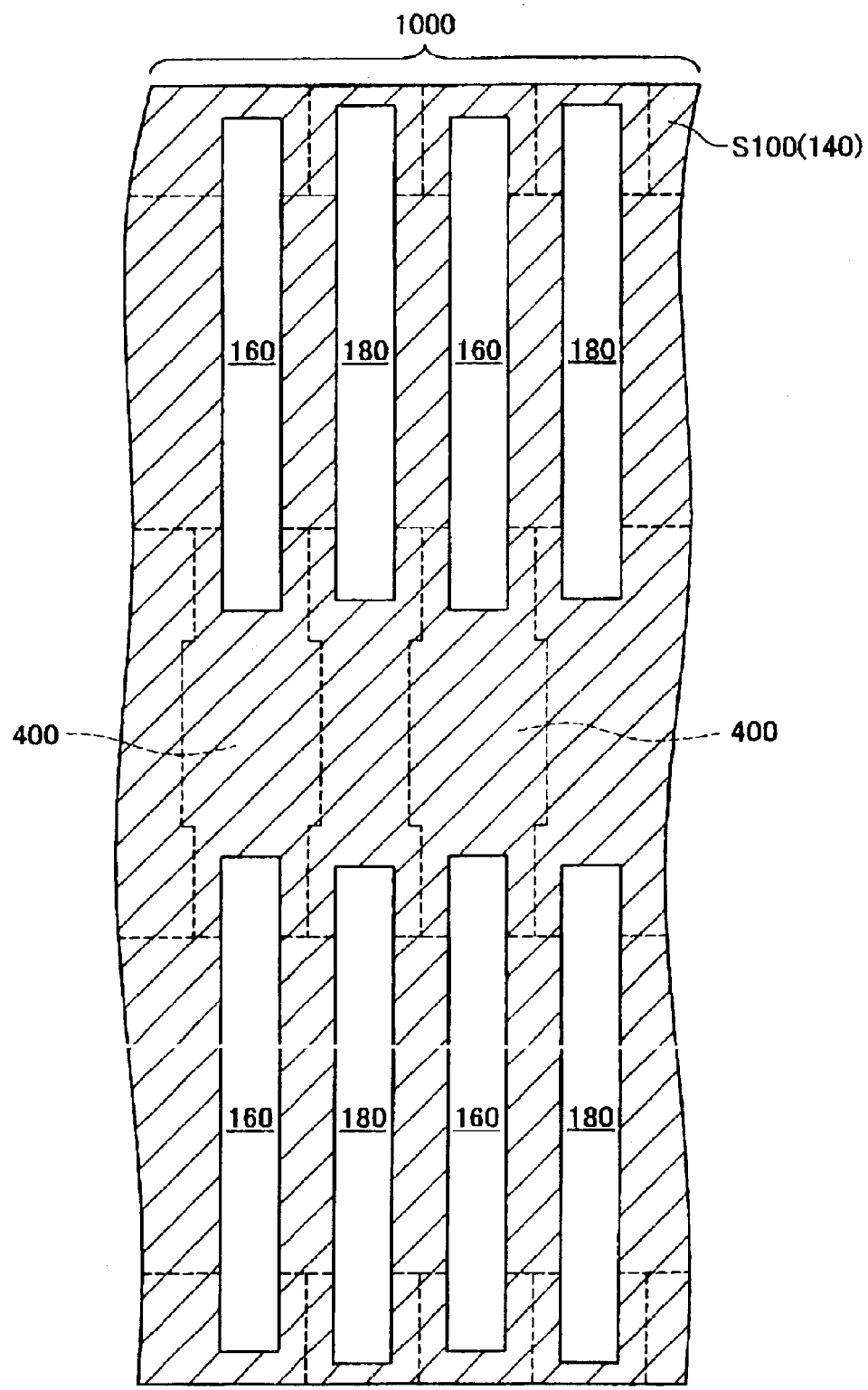
FIG. 7 is a plan view illustrating one step of the method for manufacturing the semiconductor device shown in FIG. 6.

FIG. 7 is a plan view of the state after the patterning step. By the patterning step, opening sections 160 and 180 are provided in a stacked layered body of the gate layer 140 and the stopper layer S100 in the memory region 1000. The opening sections 160 and 180 generally correspond to regions where impurity layers 16 and 18 are formed by an ion implantation to be conducted later. Then, in subsequent steps, side dielectric layers and control gates are formed along side surfaces of the opening sections 160 and 180.

Figure 8:
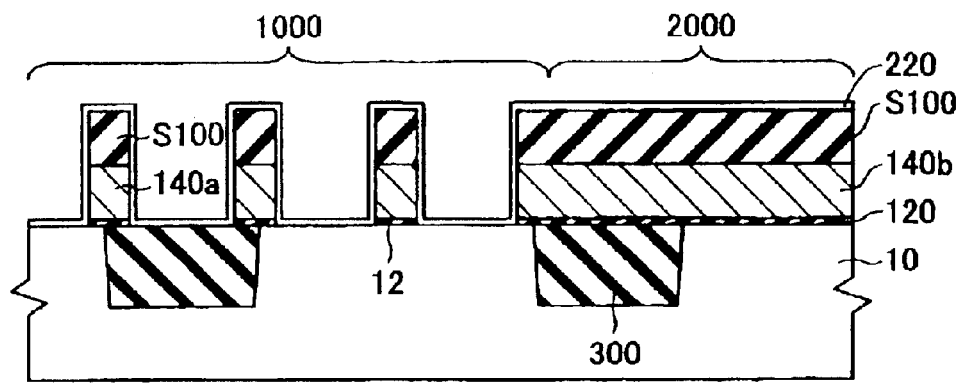
FIG. 8 is a cross-sectional view illustrating one step of the method for manufacturing the semiconductor device shown in FIGS. 1–4.

(3) As shown in FIG. 8, an ONO film 220 is formed over the entire surface of the semiconductor substrate 10. The ONO film 220 is formed by successively depositing a first silicon oxide layer (O), a silicon nitride layer (N) and a second silicon oxide layer (O). The first silicon oxide layer may be formed by using, for example, a thermal oxidation method or a CVD method. The silicon nitride layer may be formed by using, for example, a CVD method. The second silicon oxide layer may be formed by using, for example, a CVD method, and more particularly a high temperature oxidation (HTO) method. After forming these layers, an anneal treatment may preferably be conducted to densify each of the layers.

The ONO film 220 would become second gate dielectric layers 22 and side dielectric layers 24 as well as second contact dielectric layers 210 (see FIG. 4) in a patterning process to be conducted later.

Figure 9:
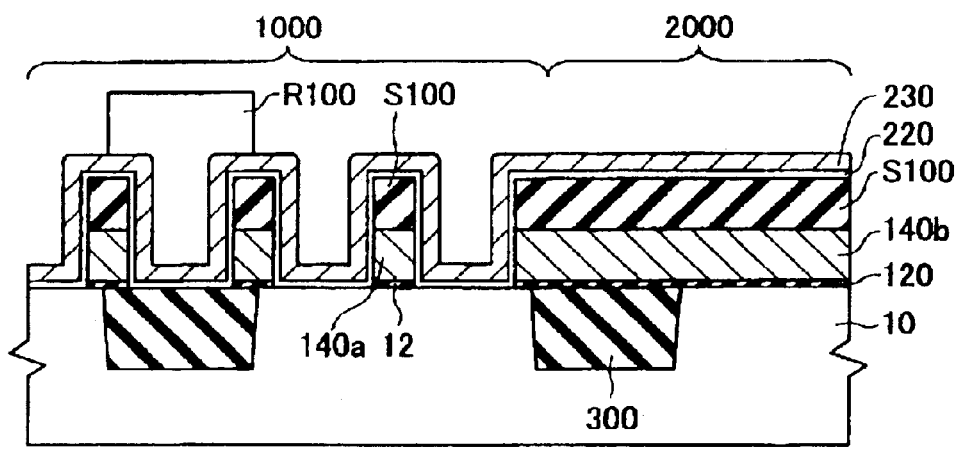
FIG. 9 is a cross-sectional view illustrating one step of the method for manufacturing the semiconductor device shown in FIGS. 1–4.

(4) As shown in FIG. 9, a doped polysilicon layer 230 is formed over the entire surface over the ONO film 220. The doped polysilicon layer 230 is etched later to become conductive layers 40 that form control gates 20 and 30 (see FIG. 1) and second conductive layers 232 of the common contact sections 200 (see FIG. 3).

Next, resist layers R100 are formed in regions where the common contact sections are to be formed.

Figure 10:
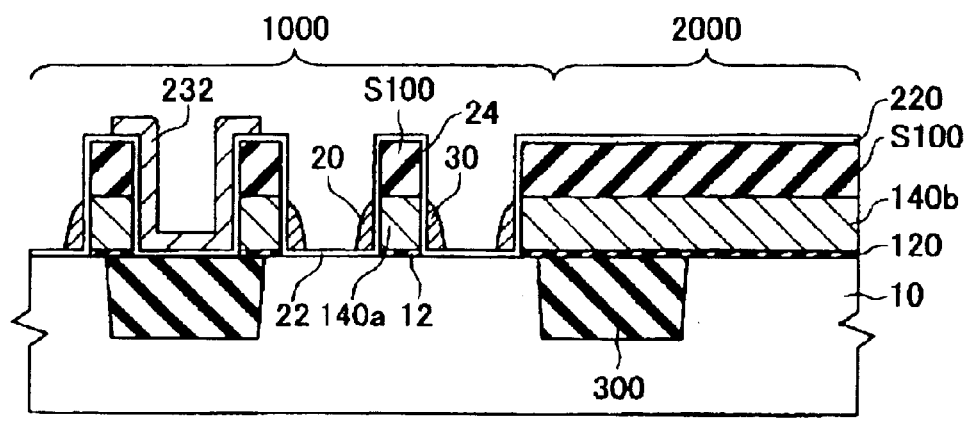
FIG. 10 is a cross-sectional view illustrating one step of the method for manufacturing the semiconductor device shown in FIGS. 1–4.

(5) As shown in FIG. 10, the doped polysilicon layer 230 (see FIG. 9) is entirely, anisotropically etched by using the resist layers R100 as a mask to form first and second control gates 20 and 30 and second contact conductive layers 232.

In other words, by this etching step, the control gates 20 and 30 in the form of sidewalls are formed along side surfaces of the openings sections 160 and 180 in the memory region 1000 (see FIG. 7). At the same time, second contact conductive layers 232 are formed at portions that are masked by the resist layers R100 (see FIG. 9). In the mean time, the doped polysilicon layer 230 deposited in the logic circuit region 2000 is completely or substantially completely removed. However, in the boundary region, the doped polysilicon layer 230 remains in the form of sidewalls on side surfaces of one end sections of the gate layers 140b (on the side of the memory region 1000). Thereafter, the resist layer R100 is removed.

Figure 11:
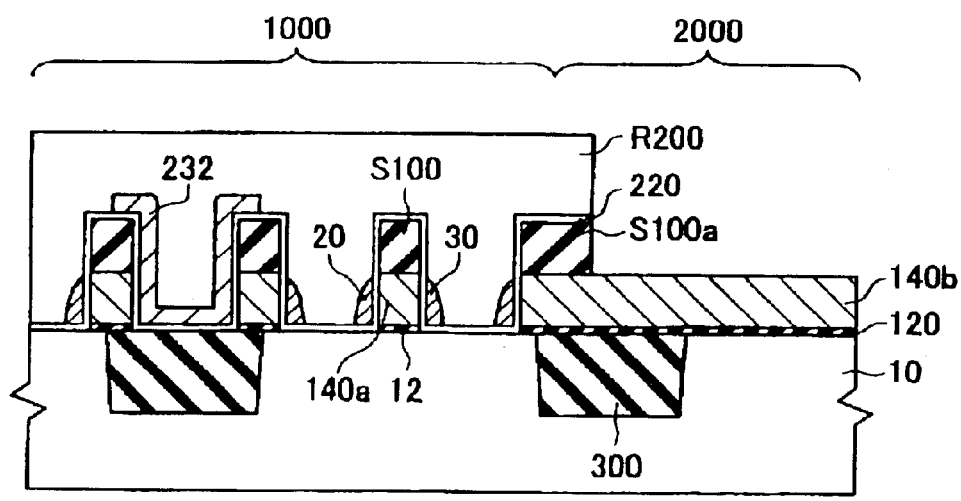
FIG. 11 is a cross-sectional view illustrating one step of the method for manufacturing the semiconductor device shown in FIGS. 1–4.

(6) As shown in FIG. 11, a resist layer R200 that covers the entire area of the memory region 1000 and extends to a portion of the logic circuit region 2000 is formed. Then, the ONO film 220 and the stopper layer S100 in the logic circuit region 2000 are removed, using the resist layer R200 as a mask. By this etching step, the stopper layer S100 within the logic circuit region 2000 except the boundary region is entirely or substantially entirely removed.

At this moment, a region of the gate layer 140b located in the boundary region of the memory region 1000 and the logic circuit region 2000, which is covered by the resist layer used in the etching step (2) above and the resist layer R200 that is used in the current etching step (6), becomes a boundary section 140c (see FIG. 4) in succeeding steps. Also, the stopper layer S100a that is formed by this patterning has a greater width than that of other stopper layers S100 in the memory region 1000. Then, the resist layer R200 is removed.

Figure 12:
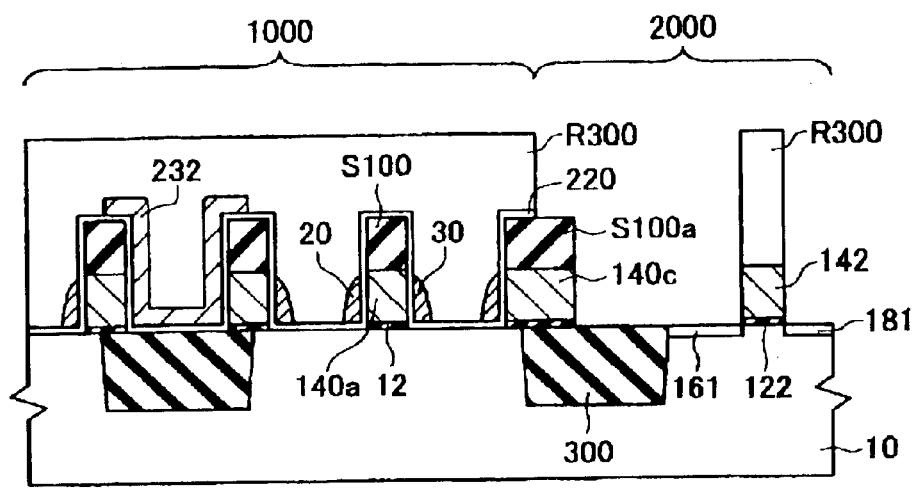
FIG. 12 is a cross-sectional view illustrating one step of the method for manufacturing the semiconductor device shown in FIGS. 1–4.

(7) As shown in FIG. 12, a resist layer R300 for forming gate electrodes 142 is formed. The resist layer R300 is patterned in a manner to cover the entire memory region 1000 and predetermined portions in the logic circuit region 2000. Then, the gate layer 140b (see FIG. 11) is etched by using the resist layer R300 as a mask to form gate electrodes 142 in the logic circuit region 2000. Also, by this etching, the boundary section 140c is patterned in a self-alignment manner in the boundary region by using the resist layer R300 and the stopper layer S100a as a mask.

Then, the resist layer R300 is removed. Next, by doping an N-type impurity, extension layers 161 and 181 of source regions and drain regions are formed in the logic circuit region 2000.

Figure 13:
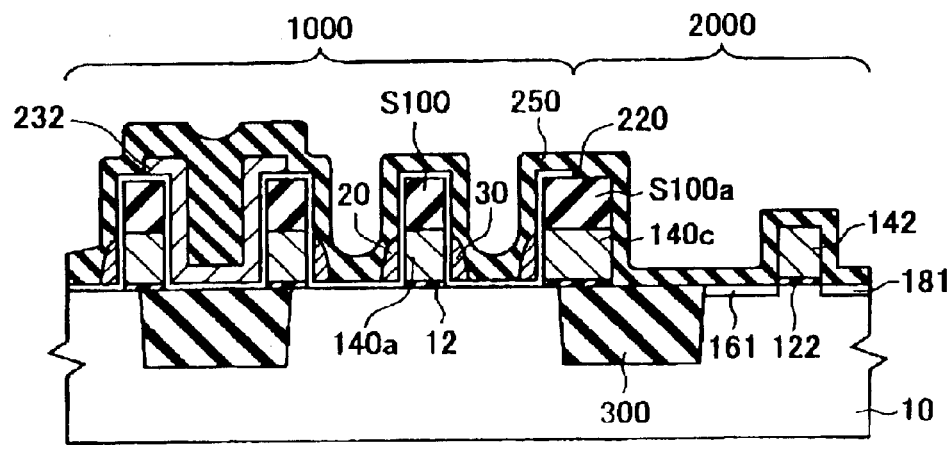
FIG. 13 is a cross-sectional view illustrating one step of the method for manufacturing the semiconductor device shown in FIGS. 1–4.

(8) As shown in FIG. 13, a dielectric layer 250, such as a silicon oxide layer or a silicon nitride layer, is formed over the entire surface of the memory region 1000 and the logic circuit region 2000.

Figure 14:
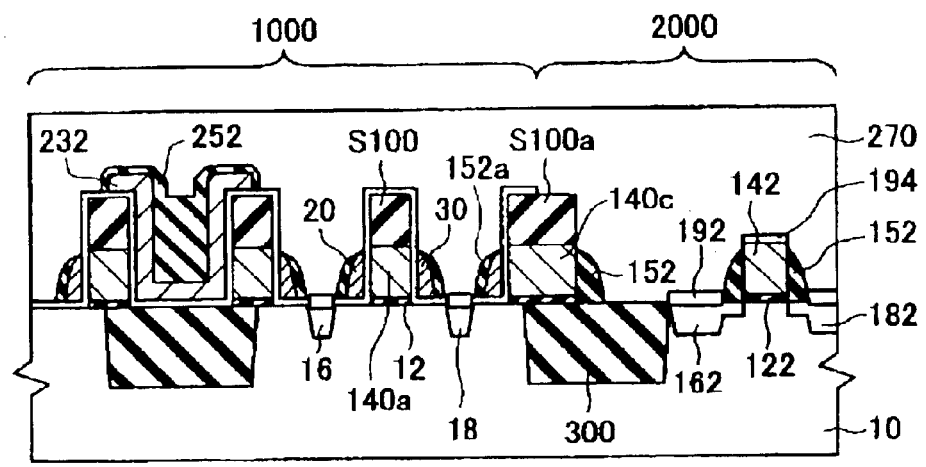
FIG. 14 is a cross-sectional view illustrating one step of the method for manufacturing the semiconductor device shown in FIGS. 1–4.

(9) As shown in FIG. 14, the dielectric layer 250 (see FIG. 12) is entirely or substantially entirely, anisotropically etched, to form sidewall dielectric layers 152 along both side surfaces of the gate electrodes 142. At the same time, a sidewall dielectric layer 152 is formed on the side surface of the boundary section 140c on the logic circuit region 2000. Also, dielectric layers 152a are left on the control gates 20 and 30. Also, a third contact dielectric layer 252 that covers the second contact conductive layer 232 is formed. Further, by this etching, the dielectric layers deposited on regions where silicide layers are to be formed in succeeding steps, for example, regions where impurity layers 16 and 18 are to be formed in the memory region 1000 and regions where impurity layers 162 and 182 are to be formed in the logic circuit region 2000 by an ion implantation to be conducted in a succeeding step, and on the gate electrodes 142 in the logic circuit region 2000, are removed, the semiconductor substrate is exposed in the corresponding regions.

Then, N-type impurity ions are implanted to form impurity layers 16 and 18 that each form a source region or a drain region in the memory region 1000, and impurity layers 162 and 182 that each form a source region or a drain region in the logic circuit region 2000.

Then, a metal to form silicide is deposited over the entire surface thereof. The metal for forming silicide may be, for example, titanium or cobalt. Thereafter, the metal formed on the impurity layers 16, 18, 162 and 182 and on the gate electrodes 142 is silicified to form silicide layers 92 on upper surfaces of the impurity layers 16 and 18, silicide layers 192 on upper surfaces of the impurity layers 162 and 182, and silicide layers 194 on upper surfaces of the gate electrode 142. Accordingly, by this silicification step, the gate electrodes and the source regions or drain regions of the MOS transistors 500 (see FIG. 4) in the logic circuit region are silicified in a self-alignment manner. Also, by the same silicification step, surfaces of the source regions or drain regions of the memory cells 100 (see FIG. 4) in the memory region 1000 are silicified in a self-alignment manner.

Then, a dielectric layer 270, such as a silicon oxide layer or a silicon nitride layer, is formed over the entire surface of the memory region 1000 and the logic circuit region 2000. The dielectric layer 270 is formed in a manner to cover the stopper layers S100 and S100a.

Figure 15:
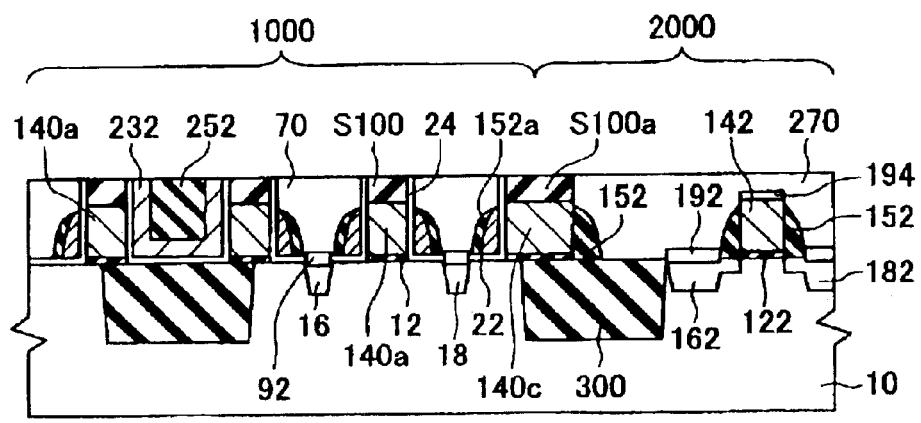
FIG. 15 is a cross-sectional view illustrating one step of the method for manufacturing the semiconductor device shown in FIGS. 1–4.

(10) As shown in FIG. 15, the dielectric layer 270 is polished by a CMP method until the stopper layers S100 and S100a are exposed, thereby planarizing the dielectric layer 270. This polishing step leaves the dielectric layer 270 between two side dielectric layers 24 opposing each other across the control gates 20 and 30, which becomes an embedded dielectric layer 70.

In this instance, in the memory region 1000, upper ends of the side dielectric layers 24 formed on side surfaces of the gate layer 140a and stopper layer S100 are located above upper ends of the first and second control gates 20 and 30 with respect to the semiconductor substrate 10. Also, in the logic circuit region 2000, the MOS transistors 500 are completely covered by the dielectric layer 270.

Accordingly, when this polishing step is completed, the stopper layers S100 and S100a exist over the gate layers 140a that are to become word gates 14 and over the boundary section 140c, respectively. On the other hand, no stopper layer exists over the gate electrodes 142, but only the dielectric layer 270 exists.

(12) The stopper layers S100 and S100a (see FIG. 15) are removed by heated phosphoric acid. As a result, at least upper surfaces of the gate layers 140a and the boundary section 140c are exposed. Then, a doped polysilicon layer is deposited over the entire surface thereof.

Figure 16:
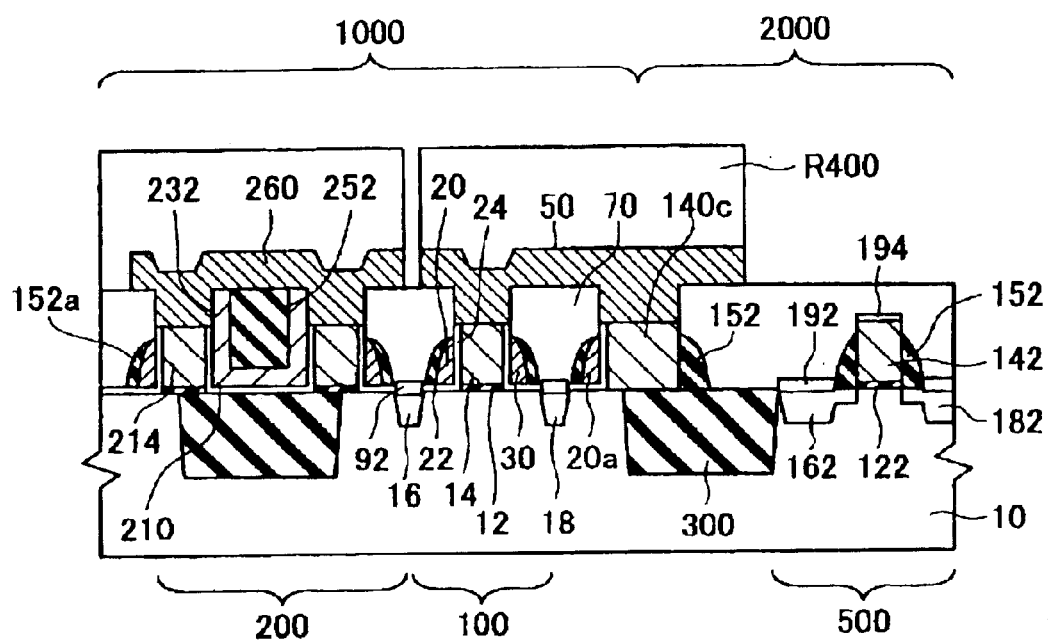
FIG. 16 is a cross-sectional view illustrating one step of the method for manufacturing the semiconductor device shown in FIGS. 1–4.

Then, as shown in FIG. 16, patterned resist layers R400 are formed over the deposited doped polysilicon layer. By patterning the deposited doped polysilicon layer using the resist layers R400 as a mask, word lines 50 and third contact conductive layers 260 are formed.

Further, the gate layers 140a (see FIG. 15) are etched by using the resist layers R400 as a mask. By this etching, the gate layers 140a without the word lines 50 formed on them are removed. As a result, word gates 14 arranged in an array can be formed. The regions where the gate layers 140a are removed correspond to regions where P-type impurity layers (element isolation impurity layers) 15 are to be formed later (see FIG. 3).

In this etching step, the conductive layers 40 that form the first and second control gates 20 and 30 remain without being etched because they are covered by the embedded dielectric layers 70. Also, the MOS transistors 500 in the logic circuit region 2000 are not affected by the etching because they are completely covered by the dielectric layer 270.

Then, a P-type impurity is doped over the entire surface of the semiconductor substrate 10. As a result, P-type impurity layers (element isolation impurity layers) 15 (see FIG. 3) are formed in regions between the word gates 14 in the Y direction. By these P-type impurity layers 15, the non-volatile semiconductor memory devices 100 are more securely isolated from one another.

(12) Then, after a first interlayer dielectric layer is formed, contact holes are formed by a related art method, and conduction layers in the contact holes and first wiring layers can be formed. For example, after contact holes are formed in an interlayer dielectric layer 72, conductive layers 82 and wiring layers 80 that are connected to the common contact sections 200 can be formed, as shown in FIG. 4. In this step, contact sections and wiring layers can also be formed in a similar manner in the logic circuit region 2000.

By the steps described above, the semiconductor device shown in FIGS. 1–4 is manufactured.

Figure 17:
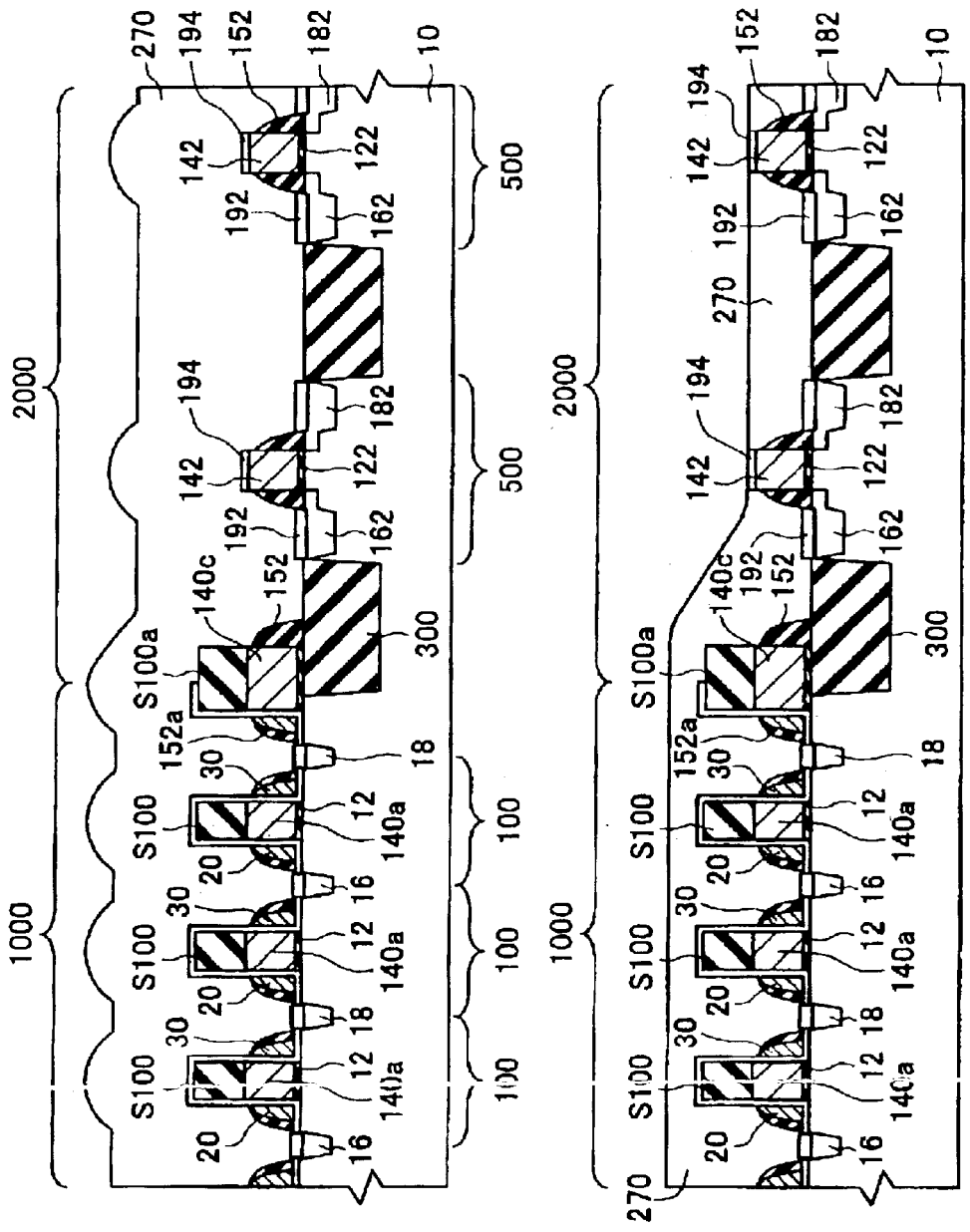
FIGS. 17(A) and 17(B) are schematics that describe characteristics of the polishing step using a CMP method.

C. Characteristics Of Polishing Dielectric Layer By Using CMP Method:

FIGS. 17 (A) and 17(B) are schematics that describe characteristics of the polishing step using a CMP method described in (10) above. FIGS. 17(A) and 17(B) schematically show cross-sections of key portions of the memory region and logic circuit region of a semiconductor device. As shown in FIG. 17 (A), a top surface of the formed dielectric layer 270 is uneven due to step differences in lower layers on which the dielectric layer 270 is formed, in other words, due to step differences caused by the gate layers 140a in the memory region 1000 and the gate electrodes 142 in the logic circuit region. More specifically, the gate layers 140a are formed with a relatively high density in the memory region 1000, and the gate electrodes 142 are formed with a relatively low density in the logic circuit region 2000. Therefore, the density of the generated unevenness is relatively high in the memory region 1000 and relatively low in the logic circuit region 2000. In particular, the unevenness generated in an area in the memory region 1000 where a plurality of memory cells 100 are arranged and formed is higher than that of the logic circuit region 2000. In the polishing step using a CMP method, differences in the polishing rate in polishing the dielectric layer 270 may occur due to the different densities of the generated unevenness. More specifically, the logic circuit region 2000 having a relatively low density of generated unevenness is polished faster than the memory region 1000 having a relatively high density of generated unevenness. For this reason, as indicated in FIG. 17 (B), the gate electrodes 142 in the logic circuit region 2000 may be exposed before the stopper layers S100a in the memory region 1000 are exposed.

If the gate electrodes 142 are exposed, in the step (11) described above in which the word gates 14 of memory cells 100 are patterned, the MOS transistors 500 may be exposed to an etching gas, and their characteristics may be affected.

Also, since the density of generated unevenness of an area of the memory region 1000 where a plurality of memory cells are arranged and formed is relatively high, the height of the top surface of the dielectric layer 270 in the above area tends to become greater than that of the logic circuit region 2000 that has a relatively low density of generated unevenness, which causes a step difference in the surface of the dielectric layer 270. Due to the step difference in the surface and difference in the polishing rate, the top surface of the dielectric layer 270 after polishing by a CMP method is not planarized and step differences may be generated therein.

Due to advanced miniaturization of wirings and the like formed in layers above the dielectric layer 270, miniaturization of the wirings and the like to be formed in the upper layers would become difficult if the dielectric layer 270 is uneven and has step differences.

As described above, the polishing step that uses a CMP method described in the step (10) above is performed such that the MOS transistors 500 are exposed to an etching gas and their characteristics are affected. Also, it is performed such that miniaturization of wirings or the like to be formed in layers above the dielectric layer 270 would become difficult.

Figure 18:
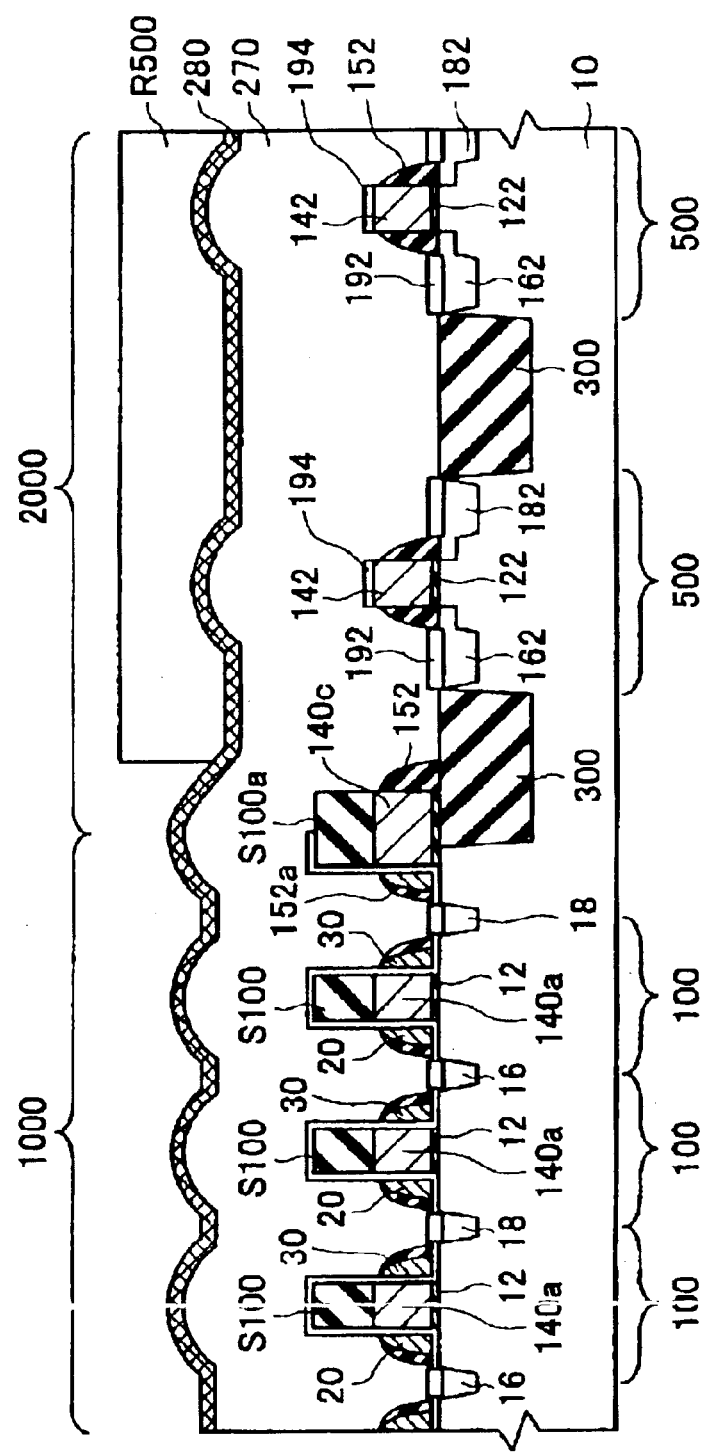
FIG. 18 is a cross-sectional view illustrating one step of a method for manufacturing a semiconductor device in accordance with an embodiment of the present invention.
Figure 19:
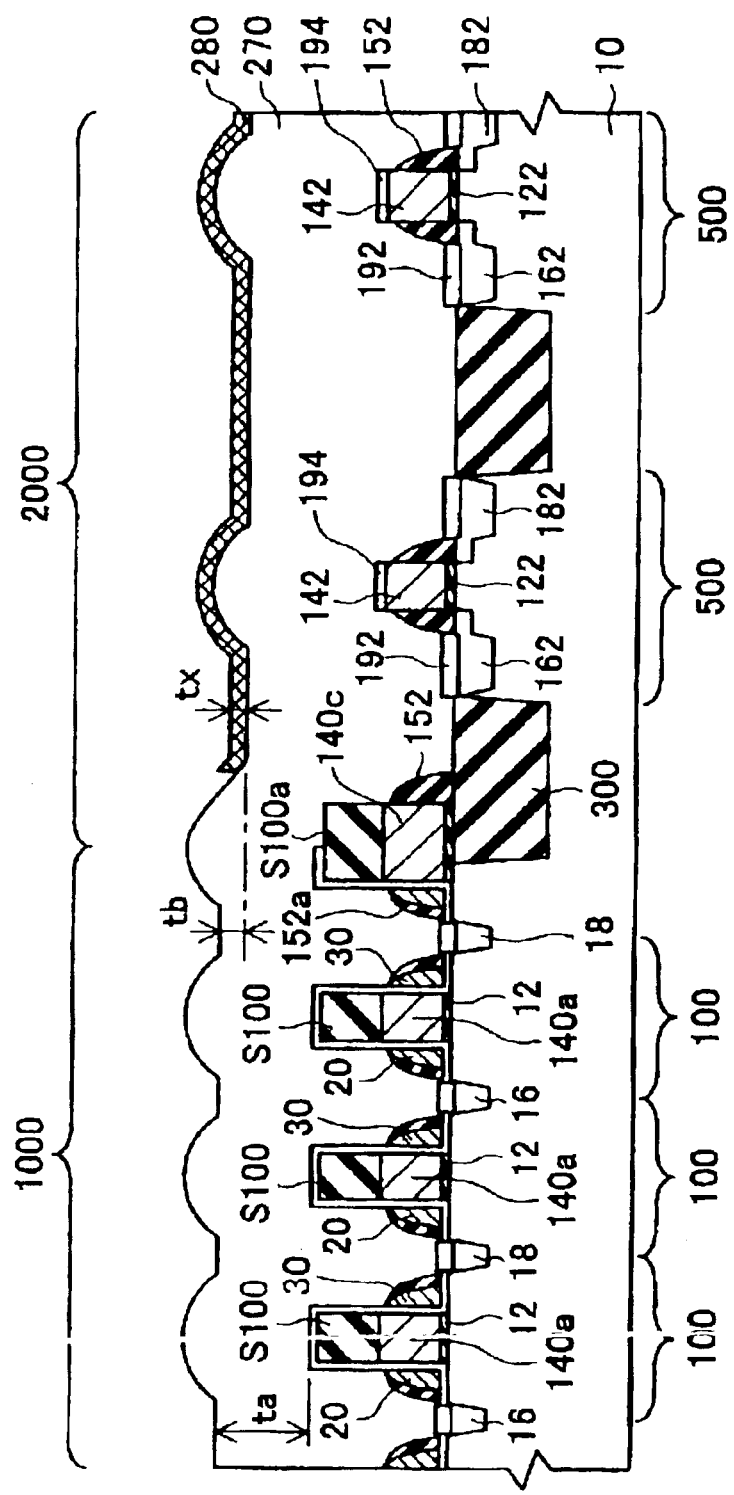
FIG. 19 is a cross-sectional view illustrating one step of the method for manufacturing a semiconductor device in accordance with the embodiment of the present invention.
Figure 20:
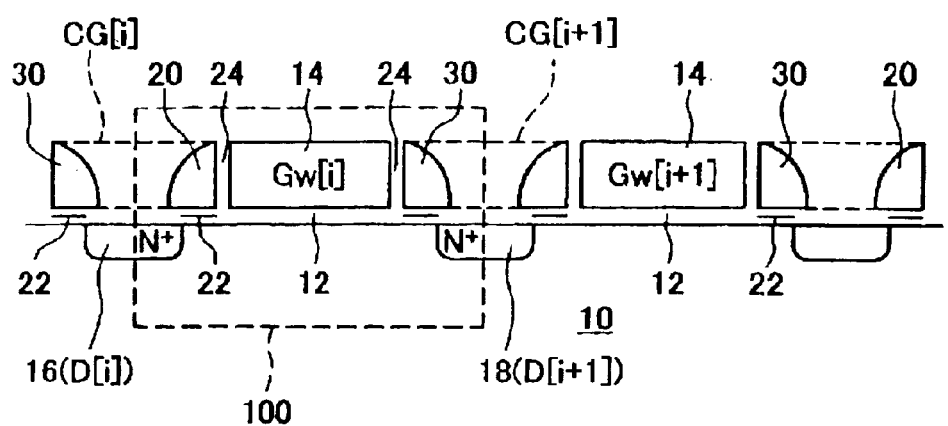
FIG. 20 is a cross-sectional view of a related art MONOS type memory cell.

D. Method For Manufacturing Semiconductor Device in Accordance with Embodiment of the Present Invention:

In view of the above, in the method for manufacturing a semiconductor device in accordance with the embodiment of the present invention, after steps indicated in FIGS. 18 and 19 are conducted, the step of polishing the dielectric layer 270 using a CMP method in the step (10) described above is conducted.

First, as shown in FIG. 18, a polishing restricting layer 280 is formed over the entire surface of the dielectric layer 270 (see FIG. 18). The polishing restricting layer 280 may be formed from a silicon nitride, such as $Si_3N_4$, SiON or the like, or a metal, such as TiN, W, Ti or the like. In the present embodiment example, the polishing restricting layer 280 is formed from $Si_3N_4$.

Then, a resist layer R500 that covers the polishing restricting layer 280 in the logic circuit region 2000 is formed.

Then, the polishing restricting layer 280 (see FIG. 18) is entirely, anisotropically etched by using the resist layer R500 as a mask, as indicated in FIG. 19, such that portions of the polishing restricting layer 280 corresponding to opening regions of the resist layer R500 are removed. Then, the resist layer R500 is removed.

After the steps described above, the dielectric layer 270 is polished by a CMP method in the step (10) described above.

It the steps described above, the polishing restricting layer 280 is formed on the dielectric layer 270 in the logic circuit region 2000 where the polishing by a CMP method advances relatively quickly. In this state, by polishing the dielectric layer 270 by a CMP method, the polishing of the dielectric layer 270 can be slowed down in an area where the polishing restricting layer 280. Accordingly, the thickness of the polishing restricting layer 280 may be adjusted according to differences in the polishing rate, such that the polishing can be conducted in a manner that the heights of the dielectric layer 270 after the polishing step become equal in the memory region 1000 and the logic circuit region 2000. For example, it can be assumed that the dielectric layer 270 is formed from $SiO_2$, and the polishing restricting layer 280 is formed from $Si_3N_4$, and a polishing rate ratio (selection ratio) in polishing $SiO_2$ and $Si_3N_4$ by a CMP method is 1:3. In this case, when a step difference in the dielectric layer 270 is tb, and a thickness of the dielectric layer 270 measured from the stopper layer S100 to a bottom surface of the unevenness of the dielectric layer 270 is ta, the thickness tx of the polishing restricting layer 280 may preferably be adjusted in a range specified by the following formula:

$$tb/3 < tx < ta/3$$

As described above, by the method for manufacturing a semiconductor device in accordance with the present embodiment, in a polishing step by using a CMP method, it is possible to prevent or substantially prevent the gate electrodes 142 in the logic circuit region 2000 from being exposed before the stopper layers S100a in the memory region 1000 are exposed.

Furthermore, since the dielectric layer 270 can be planarized more accurately, wirings and the like to be formed in layers above the dielectric layer 270 can be miniaturized.

A boundary region between the memory region 1000 and the logic circuit region 2000, in other words, a boundary adjacent to the boundary section 140c (see FIG. 18) where the polishing restricting layer 280 is formed, may be formed depending on the step difference in the surface of the dielectric layer 270.

Also, the polishing restricting layer 280 may not necessarily be formed in the logic circuit region 2000; for example, the polishing restricting layer 280 may be formed in areas on the dielectric layer 270 that are polished relatively quickly. In other words, the polishing restricting layer 280 may be formed such that step differences in the surface of the dielectric layer 270 that can be generated through polishing the dielectric layer 270 are restricted.

One exemplary embodiment of the present invention is described above. However, the present invention is not limited to this exemplary embodiment, and many modifications can be made within the scope of the subject matter of the present invention. For example, although a semiconductor substrate in a bulk form is used as a semiconductor layer in the above embodiment, a semiconductor layer formed of a SOI substrate may be used.

What is claimed is:

1. A method for manufacturing a semiconductor device including a memory region that includes a non-volatile memory device and a logic circuit region that includes a peripheral circuit for the non-volatile memory device, the method comprising:

forming a semiconductor substrate having a conductive layer that is to become a word gate of the non-volatile semiconductor device;

forming a stopper layer above the conductive layer;

forming sidewall-like control gates on both side surfaces of the conductive layer through ONO films above a semiconductor layer of the memory region;

forming a gate electrode of a dielectric gate field effect transistor above the semiconductor layer of the logic circuit region;

forming a dielectric layer over an entire surface of the memory region and the logic circuit region of the semiconductor substrate;

forming a polishing restricting layer uniformly above a part of the dielectric layer in the logic circuit region; and polishing the dielectric layer uniformly over both the memory region and the logic circuit region such that the stopper layer within the memory region is exposed, and the gate electrode within the logic circuit region is not exposed.

2. The method for manufacturing a semiconductor device according to claim 1, the step of forming the polishing restricting layer includes forming the polishing restricting layer with at least one of a silicon nitride and a metal.

3. A method for manufacturing a semiconductor device including a memory region that includes a non-volatile memory device and a logic circuit region that includes a peripheral circuit for the non-volatile memory device, the method comprising:

forming a first dielectric layer above a semiconductor layer;

forming a first conductive layer above the first dielectric layer;

forming a stopper layer above the first conductive layer;

patterning the stopper layer and the first conductive layer in the memory region;

forming an ONO film over an entire surface of the memory region and the logic circuit region;

forming a second conductive layer above the ONO film;

anisotropically etching the second conductive layer to form sidewall-like control gates on both side surfaces of the first conductive layer through the ONO film at least within the memory region;

removing the stopper layer within the logic circuit region;

patterning the first conductive layer within the logic circuit region to form a gate electrode of a dielectric gate field effect transistor within the logic circuit region;

forming sidewall dielectric layers at least on both side surfaces of the gate electrode;

forming a first impurity layer that is to become at least one of a source region and a drain region of the non-volatile memory device and a second impurity layer that is to become at least one of a source region and a drain region of the dielectric gate field effect transistor;

forming a silicide layer on surfaces of the first impurity layer, the second impurity layer and the gate electrode;

forming a second dielectric layer over an entire surface of the memory region and the logic circuit region;

forming a polishing restricting layer uniformly over a part of the second dielectric layer in the logic circuit region;

polishing the second dielectric layer uniformly over both the memory region and the logic circuit region such that the stopper layer within the memory region is exposed, and the gate electrode within the logic circuit region is not exposed;

removing the stopper layer within the memory region; and patterning the first conductive layer within the memory region to form a word gate of the non-volatile memory device within the memory region.

4. The method for manufacturing a semiconductor device according to claim 3, the step of forming the polishing restricting layer includes forming with a silicon nitride or a metal.

* * * * *